United States Patent
Fujiwara et al.

(10) Patent No.: US 11,929,539 B2
(45) Date of Patent: Mar. 12, 2024

(54) DIRECTIONAL COUPLER AND SEMICONDUCTOR CHIP

(71) Applicant: Mitsubishi Electric Corporation, Tokyo (JP)

(72) Inventors: Takanobu Fujiwara, Tokyo (JP); Tatsuya Hagiwara, Tokyo (JP); Masaomi Tsuru, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 450 days.

(21) Appl. No.: 17/378,863

(22) Filed: Jul. 19, 2021

(65) Prior Publication Data

US 2021/0344095 A1    Nov. 4, 2021

Related U.S. Application Data

(63) Continuation of application No. PCT/JP2019/007309, filed on Feb. 26, 2019.

(51) Int. Cl.
*H03F 3/45* (2006.01)
*H01P 5/18* (2006.01)
*H03F 3/16* (2006.01)

(52) U.S. Cl.
CPC .................. *H01P 5/18* (2013.01); *H03F 3/16* (2013.01)

(58) Field of Classification Search
CPC ..................................... H03F 3/45; H03F 1/07
(Continued)

(56) References Cited

U.S. PATENT DOCUMENTS 6,552,634 B1 *  4/2003  Raab ....................... H03F 3/602
                                                          330/53
6,624,694 B2 *  9/2003  Ma ........................... H03F 3/602
                                                          330/126

(Continued)

FOREIGN PATENT DOCUMENTS

JP        2006-87119 A      3/2006
JP        2015-185971 A    10/2015
JP        2017-28859 A      2/2017

OTHER PUBLICATIONS

Frye et al., "A 2-GHz Quadrature Hybrid Implemented in CMOS Technology", IEEE Journal of Solid-State Circuits, Mar. 2003, vol. 38, No. 3, pp. 550-555.

(Continued)

*Primary Examiner* — Henry Choe
(74) *Attorney, Agent, or Firm* — Birch, Stewart, Kolasch & Birch, LLP

(57) ABSTRACT

A directional coupler is configured so as to include: a resistive element in which one end thereof is connected to a first terminal and the other end is connected to a second terminal; a first amplifier circuit for outputting either a current directly proportional to a first voltage applied to the one end of the resistive element or a current directly proportional to a second voltage applied to the other end of the resistive element; a second amplifier circuit for outputting a first current which is directly proportional to the voltage difference between the first voltage applied to the one end of the resistive element and the second voltage applied to the (Continued)

other end of the resistive element and whose polarity is different from that of the current outputted from the first amplifier circuit when a signal is flowing from the first terminal to the second terminal, and for outputting a second current which is directly proportional to the voltage difference between the first voltage and the second voltage and whose polarity is identical to that of the current outputted from the first amplifier circuit when a signal is flowing from the second terminal to the first terminal; and a first adder circuit for outputting either a signal having a voltage value directly proportional to a current which is the sum total of the current outputted from the first amplifier circuit and the first current or a signal having a voltage value directly proportional to a current which is the sum total of the current outputted from the first amplifier circuit and the second current to a third terminal.

20 Claims, 7 Drawing Sheets

(58) Field of Classification Search
USPC .......................................... 330/252, 69, 124 R
See application file for complete search history.

(56) References Cited

U.S. PATENT DOCUMENTS

| | | | |
|---|---|---|---|
| 8,107,892 B2* | 1/2012 | Moritsuka | H01P 5/227 455/78 |
| 2007/0286308 A1* | 12/2007 | Williams | H03C 5/00 375/302 |
| 2009/0098840 A1* | 4/2009 | Vaisanen | G01R 27/28 455/323 |
| 2011/0235734 A1* | 9/2011 | Kenington | H04B 7/0623 375/267 |
| 2013/0136209 A1* | 5/2013 | Saunders | H04L 27/365 375/316 |
| 2017/0023623 A1 | 1/2017 | Tsuchida et al. | |
| 2018/0375483 A1* | 12/2018 | Balteanu | H03F 1/0238 |

OTHER PUBLICATIONS

Japanese Office Action, issued in Japanese Patent Application No. 2021-501431, dated Apr. 20, 2021, with English Translation.

* cited by examiner

DIRECTIONAL COUPLER AND SEMICONDUCTOR CHIP

CROSS REFERENCE TO RELATED APPLICATIONS

This application is a Continuation of PCT International Application No. PCT/JP2019/007309, filed on Feb. 26, 2019, which is hereby expressly incorporated by reference into the present application.

TECHNICAL FIELD

The present disclosure relates to a directional coupler and a semiconductor chip.

BACKGROUND ART

As conventional directional couplers, there are directional couplers in which multiple lines are electrically connected to each other. The lines are, for example, microstrip lines or waveguides.

In order to achieve downsizing of electrical connecting portions for the multiple lines, in the proposed directional couplers, the lines are replaced with concentrated constants (for example, refer to Nonpatent Literature 1).

A directional coupler disclosed in Nonpatent Literature 1 includes two inductors as concentrated constants, and the two inductors which the directional coupler includes are electrically connected to each other.

CITATION LIST

Nonpatent Literature

Nonpatent Literature 1: Frye, Robert C., Sharad Kapur, and Robert C. Melville. "A 2-GHz quadrature hybrid implemented in CMOS technology." IEEE Journal of Solid-State Circuits 38.3 (2003): 550-555.

SUMMARY OF INVENTION

Technical Problem

In the directional coupler disclosed in Nonpatent Literature 1, it is necessary to provide an inductor which has an inductance value increasing with decrease in the frequency of a signal inputted from a terminal. However, in general, the larger inductance value inductors have, the larger physical size they have.

Therefore, a problem with the directional coupler disclosed in Nonpatent Literature 1 is that the physical size becomes large in applications where a signal in a low frequency band is inputted.

The present disclosure is made in order to solve the above-mentioned problem, and it is therefore an object of the present disclosure to obtain a directional coupler and a semiconductor chip capable of avoiding upsizing of the physical size also in applications where a signal in a low frequency band is inputted.

Solution To Problem

A directional coupler according to the present disclosure is configured so as to include: a resistive element in which one end thereof is connected to a first terminal and the other end is connected to a second terminal; a first amplifier circuit to output either a current directly proportional to a first voltage applied to the one end of the resistive element or a current directly proportional to a second voltage applied to the other end of the resistive element; a second amplifier circuit to output a first current which is directly proportional to the voltage difference between the first voltage applied to the one end of the resistive element and the second voltage applied to the other end of the resistive element and whose polarity is different from that of the current outputted from the first amplifier circuit when a signal is flowing from the first terminal to the second terminal, and to output a second current which is directly proportional to the voltage difference between the first voltage and the second voltage and whose polarity is identical to that of the current outputted from the first amplifier circuit when a signal is flowing from the second terminal to the first terminal; and a first adder circuit to output either a signal having a voltage value directly proportional to a current which is the sum total of the current outputted from the first amplifier circuit and the first current or a signal having a voltage value directly proportional to a current which is the sum total of the current outputted from the first amplifier circuit and the second current to a third terminal.

Advantageous Effects of Invention

According to the present disclosure, upsizing of the physical size can be avoided also in applications where a signal in a low frequency band is inputted.

DESCRIPTION OF EMBODIMENTS

Hereinafter, in order to explain the present disclosure in greater detail, embodiments of the present disclosure will be described with reference to the accompanying drawings.

Embodiment 1

Figure 1:
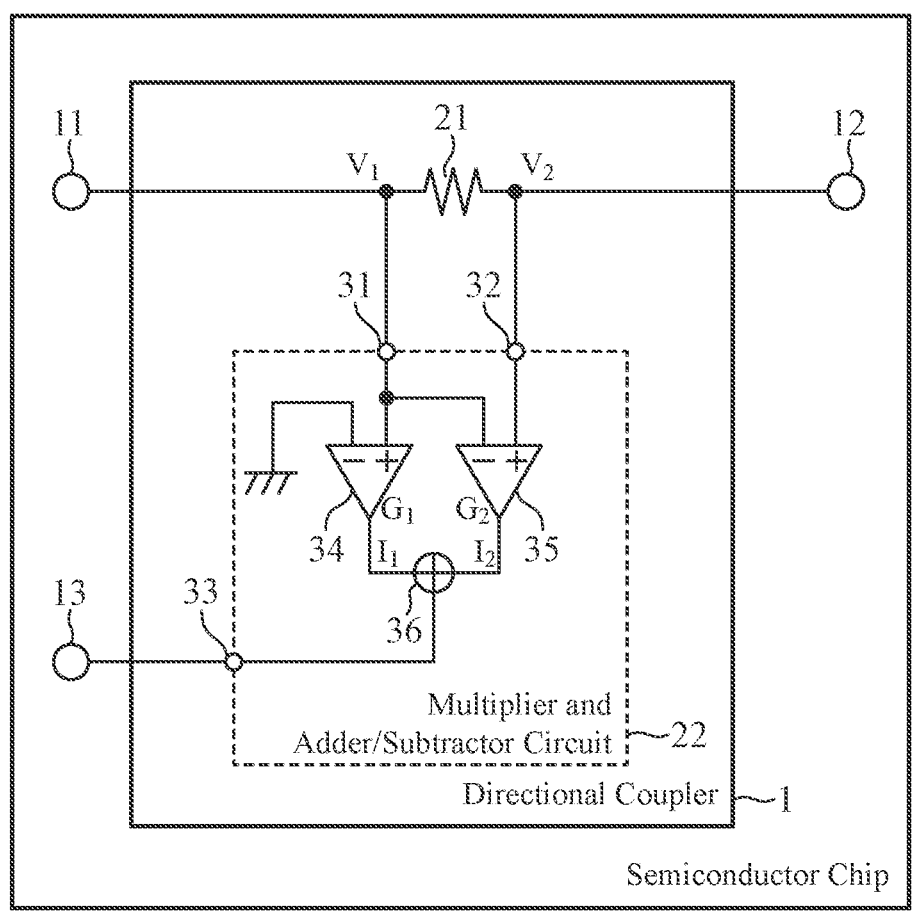
FIG. 1 is a schematic diagram showing a semiconductor chip provided with a directional coupler 1 according to Embodiment 1.

FIG. 1 is a schematic diagram showing a semiconductor chip provided with a directional coupler 1 according to Embodiment 1.

In FIG. 1, the directional coupler 1 is provided to the semiconductor chip, and includes a resistive element 21 and a multiplier and adder/subtractor circuit 22. The directional coupler 1 shown in FIG. 1 is provided to the semiconductor chip. However, this is only an example, and the directional coupler 1 shown in FIG. 1 is not limited to the one implemented in a semiconductor chip.

The directional coupler 1 does not output any signal to a third terminal 13 when a signal is flowing from a first terminal 11 to a second terminal 12. The directional coupler 1 outputs a signal to the third terminal 13 when a signal is flowing from the second terminal 12 to the first terminal 11.

The first terminal 11 is an input/output terminal for signals.

The second terminal 12 is an input/output terminal for signals.

The third terminal 13 is an output terminal for signals.

In the directional coupler 1 shown in FIG. 1, the first terminal 11, the second terminal 12, and the third terminal 13 are illustrated in such a way that each of the terminals is not included in the directional coupler 1. However, this is only an example, and each of the first, second, and third terminals 11, 12, and 13 may be included in the directional coupler 1.

One end of the resistive element 21 is connected to the first terminal 11, and the other end of the resistive element 21 is connected to the second terminal 12.

The multiplier and adder/subtractor circuit 22 includes a first input terminal 31, a second input terminal 32, and an output terminal 33.

The multiplier and adder/subtractor circuit 22 also includes a first amplifier circuit 34, a second amplifier circuit 35, and a first adder circuit 36.

The first input terminal 31 is a terminal via which a first voltage $V_1$ applied to the one end of the resistive element 21 is inputted.

The second input terminal 32 is a terminal via which a second voltage $V_2$ applied to the other end of the resistive element 21 is inputted.

The output terminal 33 is a terminal via which the multiplier and adder/subtractor circuit 22 outputs a signal.

A positive side input terminal of the first amplifier circuit 34 is connected to the one end of the resistive element 21 via the first input terminal 31, and a negative side input terminal of the first amplifier circuit 34 is connected to ground.

The first amplifier circuit 34 outputs a current $I_1$ directly proportional to the first voltage $V_1$ to the first adder circuit 36 by amplifying the first voltage $V_1$ at a first amplification factor $G_1$.

Strictly interpreting the above direct proportion, the current $I_1$ directly proportional to the first voltage $V_1$ is zero when the first voltage $V_1$ is zero. However, the above direct proportion is not limited to the strict direct proportion, and also includes a case in which the current $I_1$ is not zero even when the first voltage $V_1$ is zero.

A positive side input terminal of the second amplifier circuit 35 is connected to the other end of the resistive element 21 via the second input terminal 32, and a negative side input terminal of the second amplifier circuit 35 is connected to the one end of the resistive element 21 via the first input terminal 31.

When a signal is flowing from the first terminal 11 to the second terminal 12, the second amplifier circuit 35 outputs a first current $-I_2$ directly proportional to a voltage difference $V_2-V_1$ between the first voltage $V_1$ and the second voltage $V_2$ to the first adder circuit 36 by amplifying the voltage difference $V_2-V_1$ at a second amplification factor $G_2$. The polarity of the first current $-I_2$ is different from that of the current $I_1$ outputted from the first amplifier circuit 34.

When a signal is flowing from the second terminal 12 to the first terminal 11, the second amplifier circuit 35 outputs a second current $+I_2$ directly proportional to the voltage difference $V_2-V_1$ between the first voltage $V_1$ and the second voltage $V_2$ to the first adder circuit 36 by amplifying the voltage difference $V_2-V_1$ at the second amplification factor $G_2$. The polarity of the second current $+I_2$ is identical to that of the current $I_1$ outputted from the first amplifier circuit 34.

Strictly interpreting the above direct proportion, each of the first current $-I_2$ directly proportional to the voltage difference $V_2-V_1$ and the second current $+I_2$ directly proportional to the voltage difference $V_2-V_1$ is zero when the voltage difference $V_2-V_1$ is zero. However, the above direct proportion is not limited to the strict direct proportion, and also includes a case in which each of the first and second currents $-I_2$ and $+I_2$ is not zero even when the voltage difference $V_2-V_1$ is zero.

When a signal is flowing from the first terminal 11 to the second terminal 12, the first adder circuit 36 outputs a signal having a voltage value directly proportional to a current $I_1-I_2$ which is the sum total of the current $I_1$ outputted from the first amplifier circuit 34 and the first current $-I_2$ outputted from the second amplifier circuit 35 to the third terminal 13 via the output terminal 33.

Strictly interpreting the above direct proportion, the voltage value directly proportional to the current $I_1-I_2$ is zero when the current $I_1-I_2$ is zero. However, the above direct proportion is not limited to the strict direct proportion, and also includes a case in which the voltage value is not zero even when the current $I_1-I_2$ is zero.

When a signal is flowing from the second terminal 12 to the first terminal 11, the first adder circuit 36 outputs a signal having a voltage value directly proportional to a current $I_1+I_2$ which is the sum total of the current $I_1$ outputted from the first amplifier circuit 34 and the second current $+I_2$ outputted from the second amplifier circuit 35 to the third terminal 13 via the output terminal 33.

Strictly interpreting the above direct proportion, the voltage value directly proportional to the current $I_1+I_2$ is zero when the current $I_1+I_2$ is zero. However, the above direct proportion is not limited to the strict direct proportion, and also includes a case in which the voltage value is not zero even when the current $I_1+I_2$ is zero.

Figure 2:
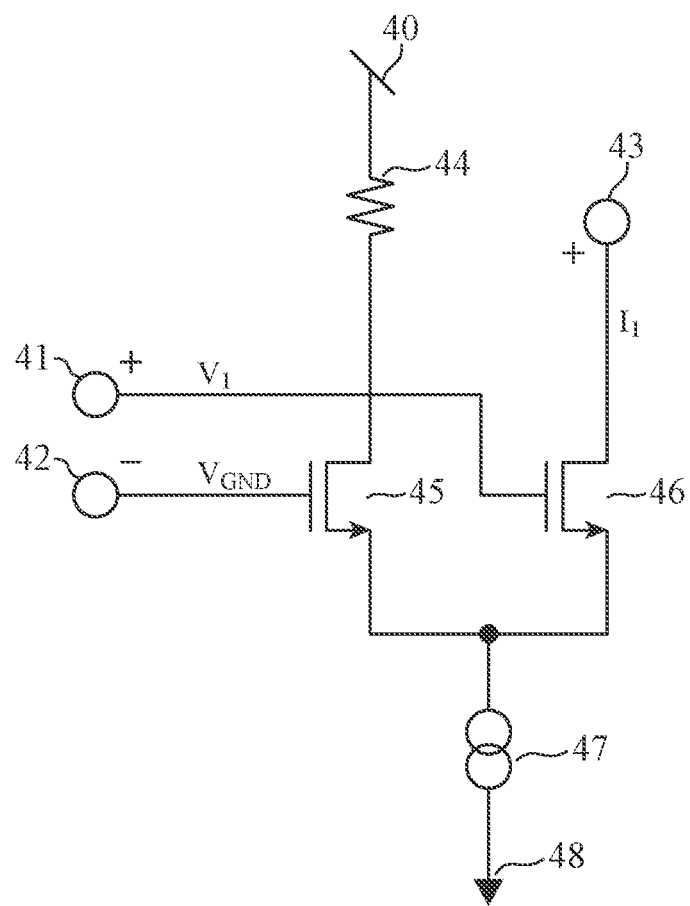
FIG. 2 is a schematic diagram showing a first amplifier circuit 34 of the directional coupler 1 according to Embodiment 1.

FIG. 2 is a schematic diagram showing the first amplifier circuit 34 of the directional coupler 1 according to Embodiment 1.

In FIG. 2, a power supply voltage is applied to a power supply voltage line 40.

An input terminal 41 is the positive side input terminal of the first amplifier circuit 34, and the first voltage $V_1$ is applied to the input terminal 41.

An input terminal 42 is the negative side input terminal of the first amplifier circuit 34 and is connected to ground.

An output terminal 43 is a terminal for outputting the current $I_1$ to the first adder circuit 36.

One end of a first pull-up resistor 44 is connected to the power supply voltage line 40, and the power supply voltage is applied to the one end of the first pull-up resistor 44.

The other end of the first pull-up resistor 44 is connected to a drain terminal of a first N-type transistor 45.

The first N-type transistor 45 is, for example, a negative metal oxide semiconductor (NMOS) transistor.

A gate terminal of the first N-type transistor 45 is connected to ground via the input terminal 42.

The drain terminal of the first N-type transistor 45 is connected to the other end of the first pull-up resistor 44.

A source terminal of the first N-type transistor 45 is connected to each of a source terminal of a second N-type transistor 46 and a positive side terminal of a first current source 47.

The second N-type transistor 46 is, for example, an NMOS transistor.

A gate terminal of the second N-type transistor 46 is connected to the one end of the resistive element 21 via the input terminal 41 and the first input terminal 31.

A drain terminal of the second N-type transistor 46 is connected to the first adder circuit 36 via the output terminal 43.

The source terminal of the second N-type transistor 46 is connected to each of the source terminal of the first N-type transistor 45 and the positive side terminal of the first current source 47.

The positive side terminal of the first current source 47 is connected to each of the source terminal of the first N-type transistor 45 and the source terminal of the second N-type transistor 46.

A negative side terminal of the first current source 47 is connected to ground 48.

The current $I_1$ directly proportional to the first voltage $V_1$ which is the voltage difference between the first voltage $V_1$ and a ground potential $V_{GND}$ is outputted from the drain terminal of the second N-type transistor 46 to the first adder circuit 36.

The first amplification factor $G_1$ in the first amplifier circuit 34 shown in FIG. 2 is the transconductance of a differential pair including the first N-type transistor 45 and the second N-type transistor 46.

Figure 3:
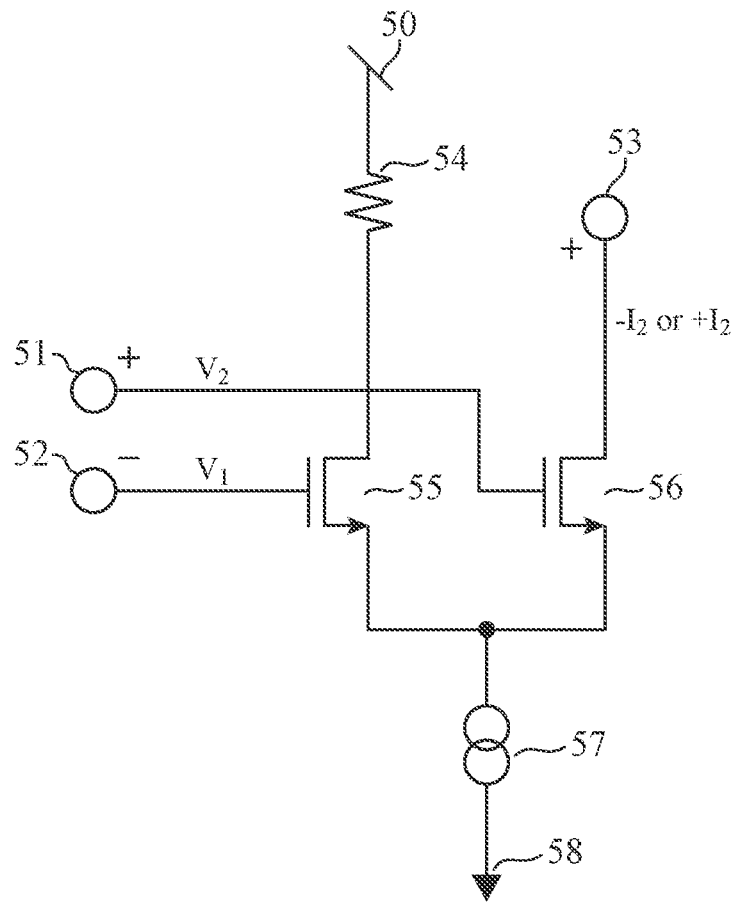
FIG. 3 is a schematic diagram showing a second amplifier circuit 35 of the directional coupler 1 according to Embodiment 1.

FIG. 3 is a schematic diagram showing the second amplifier circuit 35 of the directional coupler 1 according to Embodiment 1.

In FIG. 3, a power supply voltage is applied to a power supply voltage line 50.

An input terminal 51 is the positive side input terminal of the second amplifier circuit 35, and the second voltage $V_2$ is applied to the input terminal 51.

An input terminal 52 is the negative side input terminal of the second amplifier circuit 35, and the first voltage $V_1$ is applied to the input terminal 52.

An output terminal 53 is a terminal for outputting either the first current $-I_2$ or the second current $+I_2$ to the first adder circuit 36.

One end of a second pull-up resistor 54 is connected to the power supply voltage line 50, and the power supply voltage is applied to the one end of the second pull-up resistor 54.

The other end of the second pull-up resistor 54 is connected to a drain terminal of a third N-type transistor 55.

The third N-type transistor 55 is, for example, an NMOS transistor.

A gate terminal of the third N-type transistor 55 is connected to the one end of the resistive element 21 via the input terminal 52 and the first input terminal 31.

The drain terminal of the third N-type transistor 55 is connected to the other end of the second pull-up resistor 54.

A source terminal of the third N-type transistor 55 is connected to each of a source terminal of a fourth N-type transistor 56 and a positive side terminal of a second current source 57.

The fourth N-type transistor 56 is, for example, an NMOS transistor.

A gate terminal of the fourth N-type transistor 56 is connected to the other end of the resistive element 21 via the input terminal 51 and the second input terminal 32.

A drain terminal of the fourth N-type transistor 56 is connected to the first adder circuit 36 via the output terminal 53.

The source terminal of the fourth N-type transistor 56 is connected to each of the source terminal of the third N-type transistor 55 and the positive side terminal of the second current source 57.

The positive side terminal of the second current source 57 is connected to each of the source terminal of the third N-type transistor 55 and the source terminal of the fourth N-type transistor 56.

A negative side terminal of the second current source 57 is connected to ground 58.

When a signal is flowing from the first terminal 11 to the second terminal 12, the first current $-I_2$ directly proportional to the voltage difference $V_2-V_1$ between the first voltage $V_1$ and the second voltage $V_2$ is outputted from the drain terminal of the fourth N-type transistor 56 to the first adder circuit 36.

When a signal is flowing from the second terminal 12 to the first terminal 11, the second current $+I_2$ directly proportional to the voltage difference $V_2-V_1$ between the first voltage $V_1$ and the second voltage $V_2$ is outputted from the drain terminal of the fourth N-type transistor 56 to the first adder circuit 36.

The second amplification factor $G_2$ in the second amplifier circuit 35 shown in FIG. 3 is the transconductance of a differential pair including the third N-type transistor 55 and the fourth N-type transistor 56.

Figure 4:
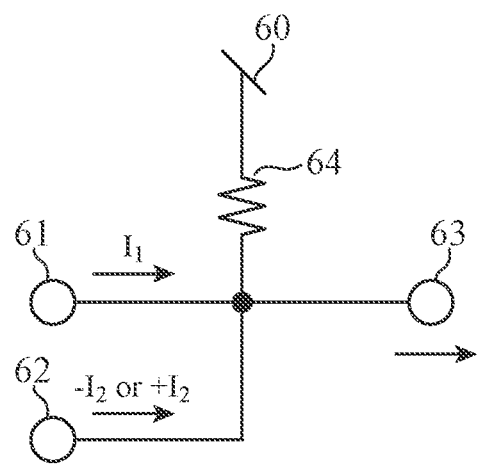
FIG. 4 is a schematic diagram showing a first adder circuit 36 of the directional coupler 1 according to Embodiment 1.

FIG. 4 is a schematic diagram showing the first adder circuit 36 of the directional coupler 1 according to Embodiment 1.

In FIG. 4, a power supply voltage is applied to a power supply voltage line 60.

An input terminal 61 is connected to the output terminal 43 of the first amplifier circuit 34. The input terminal 61 is a terminal via which the current $I_1$ outputted from the drain terminal of the second N-type transistor 46 is inputted.

An input terminal 62 is connected to the output terminal 53 of the second amplifier circuit 35. The input terminal 62 is a terminal via which either the first current $-I_2$ or the second current $+I_2$ outputted from the drain terminal of the fourth N-type transistor 56 is inputted.

An output terminal 63 is connected to the output terminal 33. The output terminal 63 is a terminal for outputting a signal to the third terminal 13 via the output terminal 33.

One end of a load resistor 64 is connected to the power supply voltage line 60, and the power supply voltage is applied to the one end of the load resistor 64.

The other end of the load resistor 64 is connected to the drain terminal of the second N-type transistor 46 via the input terminal 61 and the output terminal 43, and is also connected to the drain terminal of the fourth N-type transistor 56 via the input terminal 62 and the output terminal 53.

Further, the other end of the load resistor 64 is connected to the third terminal 13 via the output terminal 63 and the output terminal 33.

When a signal is flowing from the first terminal 11 to the second terminal 12, the current $I_1-I_2$ which is the sum total of the current $I_1$ outputted from the drain terminal of the second N-type transistor 46 and the first current $-I_2$ outputted from the drain terminal of the fourth N-type transistor 56 is converted into a voltage by the load resistor 64.

When a signal is flowing from the second terminal 12 to the first terminal 11, the current $I_1+I_2$ which is the sum total of the current $I_1$ outputted from the drain terminal of the second N-type transistor 46 and the second current $+I_2$ outputted from the drain terminal of the fourth N-type transistor 56 is converted into a voltage by the load resistor 64.

Next, the operation of the directional coupler 1 shown in FIG. 1 will be explained.

When a signal is inputted from the second terminal 12, the signal inputted from the second terminal 12 flows toward the first terminal 11.

At this time, the second voltage $V_2$ is applied to the other end of the resistive element 21, and the first voltage $V_1$ is applied to the one end of the resistive element 21.

The voltage value of the first voltage $V_1$ is lower than that of the second voltage $V_2$ by the amount of voltage drop in the resistive element 21. Therefore, $V_2 > V_1$.

The first voltage $V_1$ is applied to the one end of the resistive element 21, and, as a result, the first voltage $V_1$ is applied to the positive side input terminal of the first amplifier circuit 34.

Because ground is connected to the negative side input terminal of the first amplifier circuit 34, the voltage applied to the negative side input terminal of the first amplifier circuit 34 is the ground potential $V_{GND}$ and is approximately 0 volts.

The first amplifier circuit 34 amplifies the first voltage $V_1$ which is the voltage difference between the first voltage $V_1$ applied to the positive side input terminal and the ground potential $V_{GND} \approx 0$ applied to the negative side input terminal at the first amplification factor $G_1$.

The first amplifier circuit 34 outputs the current $I_1$ directly proportional to the first voltage $V_1$ to the first adder circuit 36 by amplifying the first voltage $V_1$ at the first amplification factor $G_1$.

The second voltage $V_2$ is applied to the other end of the resistive element 21, and, as a result, the second voltage $V_2$ is applied to the positive side input terminal of the second amplifier circuit 35.

The first voltage $V_1$ is applied to the one end of the resistive element 21, and, as a result, the first voltage $V_1$ is applied to the negative side input terminal of the second amplifier circuit 35.

The second amplifier circuit 35 amplifies the voltage difference $V_2-V_1$ between the second voltage $V_2$ applied to the positive side input terminal and the first voltage $V_1$ applied to the negative side input terminal at the second amplification factor $G_2$. Because $V_2 > V_1$ when a signal is flowing from the second terminal 12 to the first terminal 11, the voltage difference $V_2-V_1$ has a positive voltage value.

Therefore, the second amplifier circuit 35 outputs the second current $+I_2$ directly proportional to the voltage difference $V_2-V_1$ to the first adder circuit 36 by amplifying the voltage difference $V_2-V_1$ at the second amplification factor $G_2$.

The first adder circuit 36 outputs a signal having a voltage value directly proportional to the current $I_1+I_2$ which is the sum total of the current $I_1$ outputted from the first amplifier circuit 34 and the second current $+I_2$ outputted from the second amplifier circuit 35 to the third terminal 13 via the output terminal 33.

Therefore, when a signal is flowing from the second terminal 12 to the first terminal 11, a signal having the voltage value directly proportional to the total current $I_1+I_2$ is outputted from the third terminal 13.

When a signal is inputted from the first terminal 11, the signal inputted from the first terminal 11 flows toward the second terminal 12.

At this time, the first voltage $V_1$ is applied to the one end of the resistive element 21, and the second voltage $V_2$ is applied to the other end of the resistive element 21.

The voltage value of the second voltage $V_2$ is lower than that of the first voltage $V_1$ by the amount of voltage drop in the resistive element 21. Therefore, $V_1 > V_2$.

The first voltage $V_1$ is applied to the one end of the resistive element 21, and, as a result, the first voltage $V_1$ is applied to the positive side input terminal of the first amplifier circuit 34.

Because ground is connected to the negative side input terminal of the first amplifier circuit 34, the voltage applied to the negative side input terminal of the first amplifier circuit 34 is the ground potential $V_{GND}$ and is approximately 0 volts.

The first amplifier circuit 34 amplifies the first voltage $V_1$ which is the voltage difference between the first voltage $V_1$ applied to the positive side input terminal and the ground potential $V_{GND} \approx 0$ applied to the negative side input terminal at the first amplification factor $G_1$.

The first amplifier circuit 34 outputs the current $I_1$ directly proportional to the first voltage $V_1$ to the first adder circuit 36 by amplifying the first voltage $V_1$ at the first amplification factor $G_1$.

The second voltage $V_2$ is applied to the other end of the resistive element 21, and, as a result, the second voltage $V_2$ is applied to the positive side input terminal of the second amplifier circuit 35.

The first voltage $V_1$ is applied to the one end of the resistive element 21, and, as a result, the first voltage $V_1$ is applied to the negative side input terminal of the second amplifier circuit 35.

The second amplifier circuit 35 amplifies the voltage difference $V_2-V_1$ between the second voltage $V_2$ applied to the positive side input terminal and the first voltage $V_1$ applied to the negative side input terminal at the second amplification factor $G_2$. Because $V_1 > V_2$ when a signal is flowing from the first terminal 11 to the second terminal 12, the voltage difference $V_2-V_1$ has a negative voltage value.

Therefore, the second amplifier circuit 35 outputs the first current $-I_2$ directly proportional to the voltage difference $V_2-V_1$ to the first adder circuit 36 by amplifying the voltage difference $V_2-V_1$ at the second amplification factor $G_2$.

The first adder circuit 36 outputs a signal having a voltage value directly proportional to the current $I_1-I_2$ which is the sum total of the current $I_1$ outputted from the first amplifier circuit 34 and the first current $-I_2$ outputted from the second amplifier circuit 35 to the third terminal 13 via the output terminal 33.

Therefore, when a signal is flowing from the first terminal 11 to the second terminal 12, a signal having the voltage value directly proportional to the total current $I_1-I_2$ is outputted from the third terminal 13.

However, in the directional coupler 1 shown in FIG. 1, the first amplifier circuit 34 amplifies the first voltage $V_1$ at the first amplification factor $G_1$ at which the total current $I_1-I_2$ is zero. Here, the case in which the total current $I_1-I_2$ is zero is not limited to the case in which the total current is strictly zero, and includes a case in which the total current has a current value which is negligible in practical applications of the directional coupler.

Further, the second amplifier circuit 35 amplifies the voltage difference $V_2-V_1$ at the second amplification factor $G_2$ at which the total current $I_1-I_2$ is zero.

The first amplification factor $G_1$ and the second amplification factor $G_2$ at which the total current $I_1-I_2$ is zero have a relation shown by the following equation (1).

$$G_2 = G_1 \times \frac{R_0}{R} \quad (1)$$

In the equation (1), R denotes the impedance Ω of the resistive element 21, and $R_0$ denotes the impedance Ω when an outside is viewed from each of the first and second terminals 11 and 12.

Therefore, in the directional coupler 1 shown in FIG. 1, when a signal is flowing from the first terminal 11 to the second terminal 12, no signal is outputted from the third terminal 13 because the total current $I_1-I_2$ is zero.

If there is no problem in practical applications of the directional coupler even though a signal is outputted from the third terminal 13, the first amplification factor $G_1$ and the second amplification factor $G_2$ do not have to have the relation shown by the equation (1).

Hereinafter, a comparison between the physical size of the directional coupler shown in FIG. 1 and the physical size of the directional coupler disclosed in Nonpatent Literature 1 is made.

For example, in the case where the frequency of a signal is 100 MHz, an inductor needed to be included in the directional coupler disclosed in Nonpatent Literature 1 has an inductance value of approximately 7 nH, and a physical size of approximately 500×500 µm².

Because the directional coupler disclosed in Nonpatent Literature 1 includes two inductors, their physical sizes are equal to or greater than approximately 500×500×2 µm² in the case where the frequency of the signal is 100 MHz. Therefore, in the case where the frequency of the signal is equal to or less than several hundreds of MHz, the directional coupler disclosed in Nonpatent Literature 1 has a large physical size and it becomes difficult to provide the directional coupler in a semiconductor chip.

The directional coupler shown in FIG. 1 includes the resistive element 21, the first amplifier circuit 34, the second amplifier circuit 35, and the first adder circuit 36.

The physical size of the resistive element 21 is approximately 10×10 µm².

Each of the physical sizes of the first pull-up resistor 44, the first N-type transistor 45, the second N-type transistor 46, and the first current source 47 which the first amplifier circuit 34 shown in FIG. 2 includes is approximately 10×10 µm².

Each of the physical sizes of the second pull-up resistor 54, the third N-type transistor 55, the fourth N-type transistor 56, and the second current source 57 which the second amplifier circuit 35 shown in FIG. 3 includes is approximately 10×10 µm².

The physical size of the load resistor 64 which the first adder circuit 36 includes is approximately 10×10 µm².

Therefore, the physical size of the directional coupler shown in FIG. 1 is approximately 10×10×10 µm². Here, for the sake of simplicity, the space for wiring between the components which the directional coupler shown in FIG. 1 includes is not taken into consideration.

From the above description, in the case where the frequency of the signal is 100 MHz, the physical size of the directional coupler shown in FIG. 1 can be made to be greatly smaller than that of the directional coupler disclosed in Nonpatent Literature 1.

In above-mentioned Embodiment 1, the directional coupler 1 is configured in such a way as to include the resistive element 21 in which one end thereof is connected to the first terminal 11 and the other end thereof is connected to the second terminal 12, and the first amplifier circuit 34 for outputting a current directly proportional to the first voltage applied to the one end of the resistive element 21. The directional coupler 1 also includes the second amplifier circuit 35 for outputting a first current which is directly proportional to the voltage difference between the first voltage and the second voltage and whose polarity is different from that of the current outputted from the first amplifier circuit 34 when a signal is flowing from the first terminal 11 to the second terminal 12, and for outputting a second current which is directly proportional to the voltage difference between the first voltage and the second voltage and whose polarity is identical to that of the current outputted from the first amplifier circuit 34 when a signal is flowing from the second terminal 12 to the first terminal 11. Further, the directional coupler 1 includes the first adder circuit 36 for outputting either a signal having a voltage value directly proportional to a current which is the sum total of the current outputted from the first amplifier circuit 34 and the first current, or a signal having a voltage value directly proportional to a current which is the sum total of the current outputted from the first amplifier circuit 34 and the second current to the third terminal 13. Therefore, the directional coupler 1 can avoid upsizing of the physical size also in applications where a signal in a low frequency band is inputted.

Further, in Embodiment 1, the directional coupler 1 is configured in such a way that when a signal is flowing from the first terminal 11 to the second terminal 12, the first amplifier circuit 34 amplifies the first voltage at the first amplification factor at which the total current is zero, and the second amplifier circuit 35 amplifies the voltage difference between the first voltage and the second voltage at the second amplification factor at which the total current is zero. Therefore, the directional coupler 1 does not output a signal to the third terminal 13 when a signal is flowing from the first terminal 11 to the second terminal 12, but can output a signal to the third terminal 13 when a signal is flowing from the second terminal 12 to the first terminal 11.

In the directional coupler 1 shown in FIG. 1, the first amplifier circuit 34 is configured as shown in FIG. 2. However, this is only an example, and the first amplifier circuit 34 may include two level shifters 71 and 72, as shown in FIG. 5.

Figure 5:
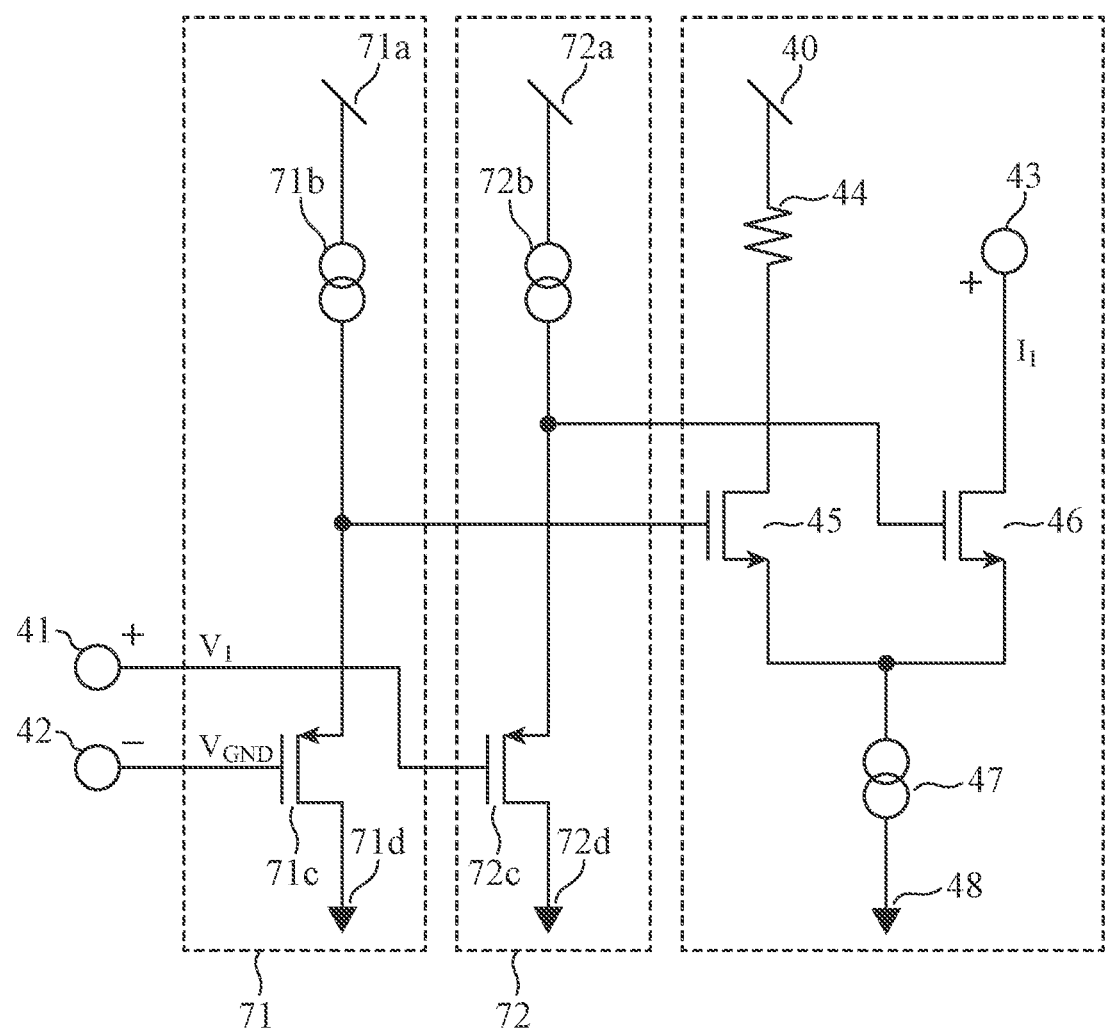
FIG. 5 is a schematic diagram showing another example of the first amplifier circuit 34 of the directional coupler 1 according to Embodiment 1.

FIG. 5 is a schematic diagram showing another example of the first amplifier circuit 34 of the directional coupler 1 according to Embodiment 1.

In FIG. 5, the level shifter 71 includes a current source 71b and a positive MOS (PMOS) transistor 71c.

The level shifter 71 adjusts the DC bias potential of a voltage applied to the gate terminal of the first N-type transistor 45.

A power supply voltage is applied to a power supply voltage line 71a.

A positive side terminal of the current source 71b is connected to the power supply voltage line 71a, and a negative side terminal of the current source 71b is connected to each of a source terminal of the PMOS transistor 71c and the gate terminal of the first N-type transistor 45.

A gate terminal of the PMOS transistor 71c is connected to the input terminal 42, and the source terminal of the PMOS transistor 71c is connected to each of the negative side terminal of the current source 71b and the gate terminal of the first N-type transistor 45.

A drain terminal of the PMOS transistor 71c is connected to ground 71d.

The level shifter 72 includes a current source 72b and a PMOS transistor 72c.

The level shifter 72 adjusts the DC bias potential of a voltage applied to the gate terminal of the second N-type transistor 46.

A power supply voltage is applied to a power supply voltage line 72a.

A positive side terminal of the current source 72b is connected to the power supply voltage line 72a, and a negative side terminal of the current source 72b is connected to each of a source terminal of the PMOS transistor 72c and the gate terminal of the second N-type transistor 46.

A gate terminal of the PMOS transistor 72c is connected to the input terminal 41, and the source terminal of the PMOS transistor 72c is connected to each of the negative side terminal of the current source 72b and the gate terminal of the second N-type transistor 46.

A drain terminal of the PMOS transistor 72c is connected to ground 72d.

The first amplifier circuit 34 includes the level shifter 71, and, as a result, even when the ground potential $V_{GND}$ deviates from zero, can adjust the voltage applied to the gate terminal of the first N-type transistor 45 to zero.

The first amplifier circuit 34 also includes the level shifter 72, and, as a result, can adjust the voltage applied to the gate terminal of the second N-type transistor 46 to a desired voltage.

In the directional coupler 1 shown in FIG. 1, the second amplifier circuit 35 is configured as shown in FIG. 3. However, this is only an example, and the second amplifier circuit 35 may include two level shifters 73 and 74, as shown in FIG. 6.

Figure 6:
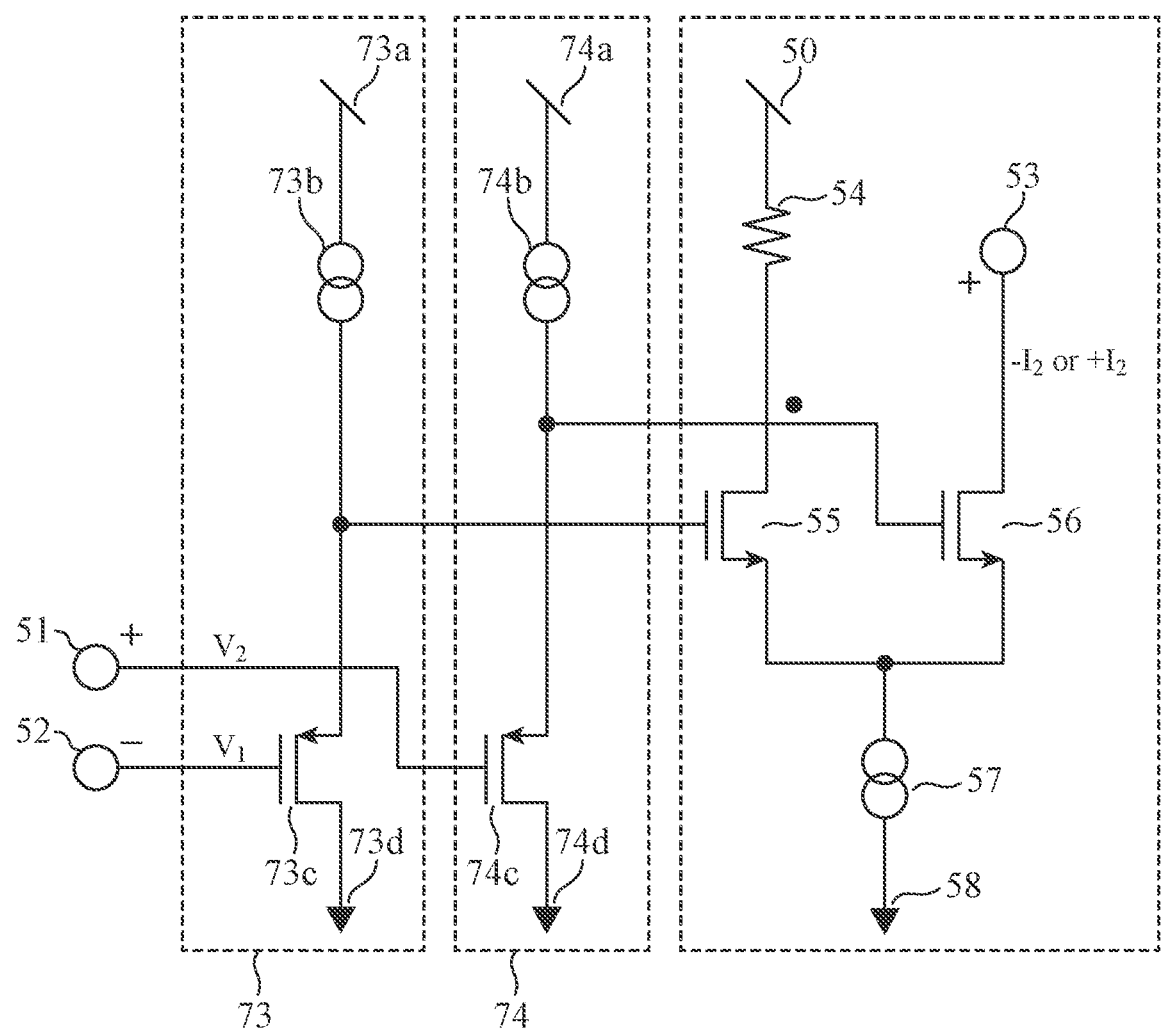
FIG. 6 is a schematic diagram showing another example of the second amplifier circuit 35 of the directional coupler 1 according to Embodiment 1.

FIG. 6 is a schematic diagram showing another example of the second amplifier circuit 35 of the directional coupler 1 according to Embodiment 1.

In FIG. 6, the level shifter 73 includes a current source 73b and a PMOS transistor 73c.

The level shifter 73 adjusts the DC bias potential of a voltage applied to the gate terminal of the third N-type transistor 55.

A power supply voltage is applied to a power supply voltage line 73a.

A positive side terminal of the current source 73b is connected to the power supply voltage line 73a, and a negative side terminal of the current source 73b is connected to each of a source terminal of the PMOS transistor 73c and the gate terminal of the third N-type transistor 55.

A gate terminal of the PMOS transistor 73c is connected to the input terminal 52, and the source terminal of the PMOS transistor 73c is connected to each of the negative side terminal of the current source 73b and the gate terminal of the third N-type transistor 55.

A drain terminal of the PMOS transistor 73c is connected to ground 73d.

The level shifter 74 includes a current source 74b and a PMOS transistor 74c.

The level shifter 74 adjusts the DC bias potential of a voltage applied to the gate terminal of the fourth N-type transistor 56.

A power supply voltage is applied to a power supply voltage line 74a.

A positive side terminal of the current source 74b is connected to the power supply voltage line 74a, and a negative side terminal of the current source 74b is connected to each of a source terminal of the PMOS transistor 74c and the gate terminal of the fourth N-type transistor 56.

A gate terminal of the PMOS transistor 74c is connected to the input terminal 51, and the source terminal of the PMOS transistor 74c is connected to each of the negative side terminal of the current source 74b and the gate terminal of the fourth N-type transistor 56.

A drain terminal of the PMOS transistor 74c is connected to ground 74d.

The second amplifier circuit 35 includes the level shifter 73 and, as a result, can adjust the voltage applied to the gate terminal of the third N-type transistor 55 to a desired voltage.

The second amplifier circuit 35 also includes the level shifter 74, and, as a result, can adjust the voltage applied to the gate terminal of the fourth N-type transistor 56 to a desired voltage.

Embodiment 2

In the directional coupler 1 shown in FIG. 1, the first amplifier circuit 34 outputs the current $I_1$ directly proportional to the first voltage $V_1$ applied to the one end of the resistive element 21 to the first adder circuit 36.

In Embodiment 2, a directional coupler 1 in which a first amplifier circuit 37 outputs a current directly proportional to a second voltage $V_2$ applied to the other end of a resistive element 21 to a first adder circuit 36 will be explained.

Figure 7:
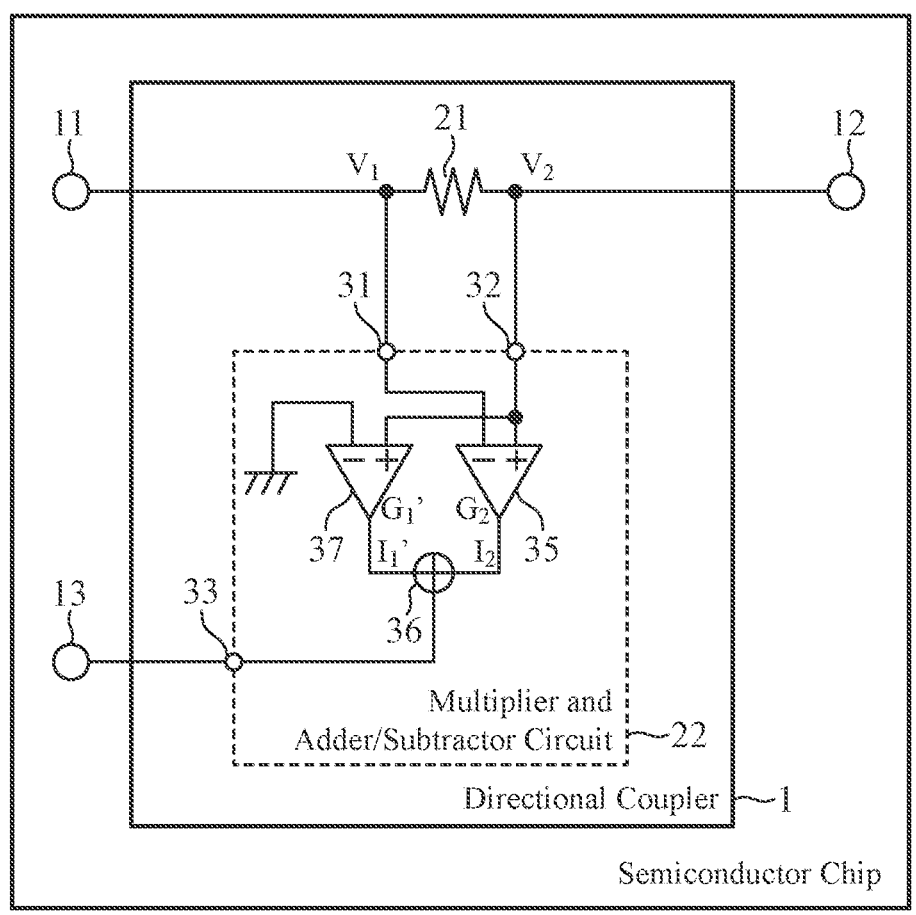
FIG. 7 is a schematic diagram showing a semiconductor chip provided with a directional coupler 1 according to Embodiment 2.

FIG. 7 is a schematic diagram showing a semiconductor chip provided with the directional coupler 1 according to Embodiment 2. In FIG. 7, because the same reference signs as those shown in FIG. 1 denote the same components or like components, an explanation of the components will be omitted hereinafter.

A positive side input terminal of the first amplifier circuit 37 is connected to the other end of the resistive element 21 via a second input terminal 32, and a negative side input terminal of the first amplifier circuit 37 is connected to ground.

The first amplifier circuit 37 outputs the current directly proportional to the second voltage $V_2$ applied to the other end of the resistive element 21 to the first adder circuit 36 by amplifying the second voltage $V_2$ at a first amplification factor $G_1'$.

Strictly interpreting the above direct proportion, the current $I_1'$ directly proportional to the second voltage $V_2$ is zero when the second voltage $V_2$ is zero. However, the above direct proportion is not limited to the strict direct proportion, and also includes a case in which the current $I_1'$ is not zero even when the second voltage $V_2$ is zero.

Next, the operation of the directional coupler 1 shown in FIG. 7 will be explained.

When a signal is inputted from a second terminal 12, the signal inputted from the second terminal 12 flows toward a first terminal 11.

At this time, the second voltage $V_2$ is applied to the other end of the resistive element 21, and a first voltage $V_1$ is applied to one end of the resistive element 21.

The voltage value of the first voltage $V_1$ is lower than that of the second voltage $V_2$ by the amount of voltage drop in the resistive element 21. Therefore, $V_2 > V_1$.

The second voltage $V_2$ is applied to the other end of the resistive element 21, and, as a result, the second voltage $V_2$ is applied to the positive side input terminal of the first amplifier circuit 37.

Because ground is connected to the negative side input terminal of the first amplifier circuit 37, the voltage applied to the negative side input terminal of the first amplifier circuit 37 is a ground potential $V_{GND}$ and is approximately 0 volts.

The first amplifier circuit 37 amplifies the second voltage $V_2$ which is the voltage difference between the second voltage $V_2$ applied to the positive side input terminal and the ground potential $V_{GND} \approx 0$ applied to the negative side input terminal at the first amplification factor $G_1'$.

The first amplifier circuit 37 outputs the current $I_1'$ directly proportional to the second voltage $V_2$ to the first adder circuit 36 by amplifying the second voltage $V_2$ at the first amplification factor $G_1'$.

A second amplifier circuit 35 outputs a second current $+I_2$ directly proportional to the voltage difference $V_2-V_1$ to the first adder circuit 36 by amplifying the voltage difference $V_2-V_1$ at a second amplification factor $G_2$, like that of Embodiment 1.

The first adder circuit 36 outputs a signal having a voltage value directly proportional to a current $I_1'+I_2$ which is the sum total of the current $I_1'$ outputted from the first amplifier circuit 34 and the second current $+I_2$ outputted from the second amplifier circuit 35 to a third terminal 13 via an output terminal 33.

Therefore, when a signal is flowing from the second terminal 12 to the first terminal 11, a signal having the voltage value directly proportional to the total current $I_1'+I_2$ is outputted from the third terminal 13.

When a signal is inputted from the first terminal 11, the signal inputted from the first terminal 11 flows toward the second terminal 12.

At this time, the first voltage $V_1$ is applied to the one end of the resistive element 21, and the second voltage $V_2$ is applied to the other end of the resistive element 21.

The voltage value of the second voltage $V_2$ is lower than that of the first voltage $V_1$ by the amount of voltage drop in the resistive element 21. Therefore, $V_1 > V_2$.

The second voltage $V_2$ is applied to the other end of the resistive element 21, and, as a result, the second voltage $V_2$ is applied to the positive side input terminal of the first amplifier circuit 37.

Because ground is connected to the negative side input terminal of the first amplifier circuit 37, the voltage applied to the negative side input terminal of the first amplifier circuit 37 is the ground potential $V_{GND}$ and is approximately 0 volts.

The first amplifier circuit 37 amplifies the second voltage $V_2$ which is the voltage difference between the second voltage $V_2$ applied to the positive side input terminal and the ground potential $V_{GND} \approx 0$ applied to the negative side input terminal at the first amplification factor $G_1'$.

The first amplifier circuit 37 outputs the current $I_1'$ directly proportional to the second voltage $V_2$ to the first adder circuit 36 by amplifying the second voltage $V_2$ at the first amplification factor $G_1'$.

The second amplifier circuit 35 outputs a first current $-I_2$ directly proportional to the voltage difference $V_2-V_1$ to the first adder circuit 36 by amplifying the voltage difference $V_2-V_1$ at the second amplification factor $G_2$, like that of Embodiment 1.

The first adder circuit 36 outputs a signal having a voltage value directly proportional to a current $I_1'-I_2$ which is the sum total of the current $I_1'$ outputted from the first amplifier circuit 37 and the first current $-I_2$ outputted from the second amplifier circuit 35 to the third terminal 13 via the output terminal 33.

Therefore, when a signal is flowing from the first terminal 11 to the second terminal 12, a signal having the voltage value directly proportional to the total current $I_1'-I_2$ is outputted from the third terminal 13.

However, in the directional coupler 1 shown in FIG. 7, the first amplifier circuit 37 amplifies the first voltage $V_1$ at the first amplification factor $G_1'$ at which the total current $I_1'-I_2$ is zero. Here, the case in which the total current $I_1'-I_2$ is zero is not limited to the case in which the total current is strictly zero, and includes a case in which the total current has a current value which is negligible in practical applications of the directional coupler.

Further, the second amplifier circuit 35 amplifies the voltage difference $V_2-V_1$ at the second amplification factor $G_2$ at which the total current $I_1-I_2$ is zero.

The first amplification factor $G_1'$ and the second amplification factor $G_2$ at which the total current $I_1'-I_2$ is zero have a relation shown by the following equation (2).

$$G_2 = G_1' \times \frac{R_0 + R}{R} \quad (2)$$

Therefore, in the directional coupler 1 shown in FIG. 7, when a signal is flowing from the first terminal 11 to the second terminal 12, no signal is outputted from the third terminal 13 because the total current $I_1'-I_2$ is zero.

From the above description, the directional coupler 1 shown in FIG. 7 can avoid upsizing of the physical size also in applications where a signal in a low frequency band is inputted, like the directional coupler 1 shown in FIG. 1.

Further, the directional coupler 1 shown in FIG. 7 can prevent a signal from being outputted to the third terminal 13 when a signal is flowing from the first terminal 11 to the second terminal 12.

Embodiment 3

In Embodiment 3, a directional coupler 1 to which each of a first terminal 11, a second terminal 12, a third terminal 13, and a fourth terminal 14 is connected will be explained.

Figure 8:
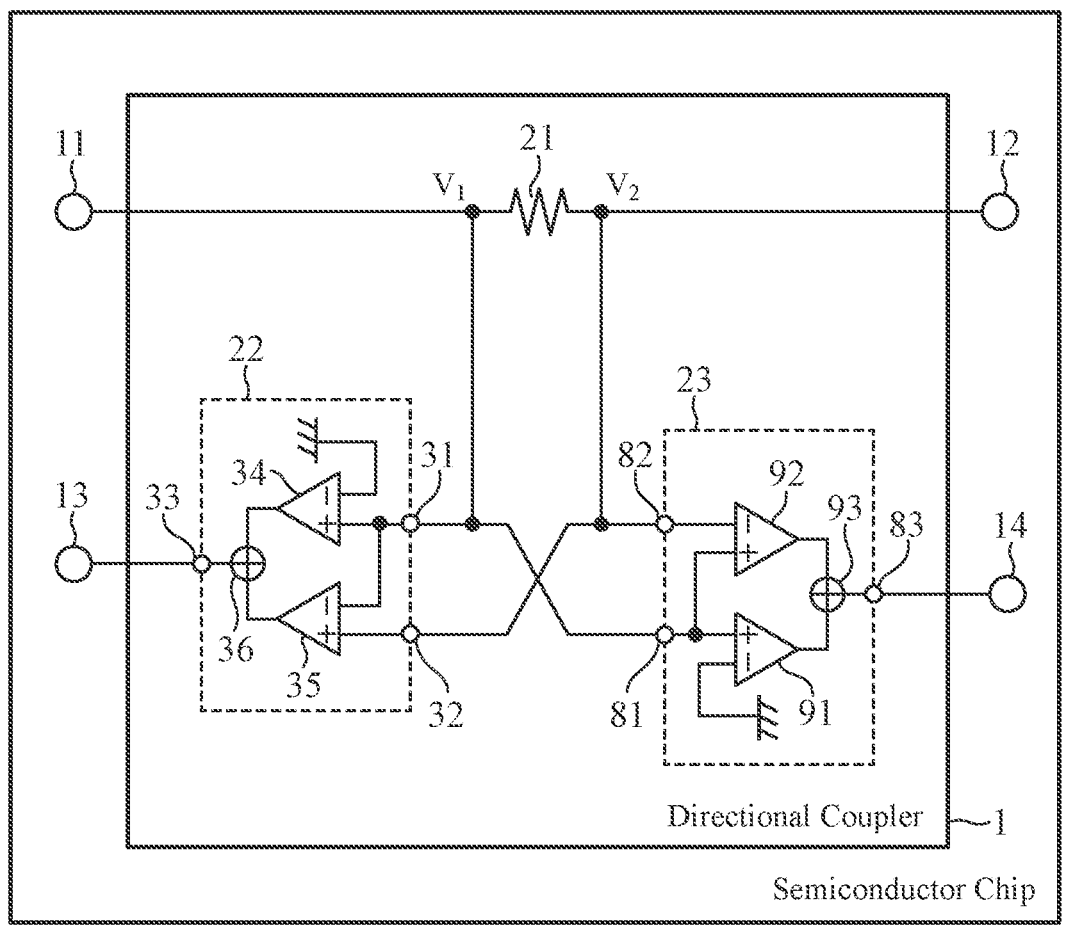
FIG. 8 is a schematic diagram showing a semiconductor chip provided with a directional coupler 1 according to Embodiment 3.

FIG. 8 is a schematic diagram showing a semiconductor chip provided with the directional coupler 1 according to Embodiment 3. In FIG. 8, because the same reference signs as those shown in FIG. 1 denote the same components or like components, an explanation of the components will be omitted hereinafter.

The directional coupler 1 is provided to a semiconductor chip, and includes a resistive element 21, a multiplier and adder/subtractor circuit 22, and a multiplier and adder/subtractor circuit 23. The directional coupler 1 shown in FIG. 8 is provided to the semiconductor chip. However, this is only an example, and the directional coupler 1 shown in FIG. 8 is not limited to the one implemented in a semiconductor chip.

The directional coupler 1 shown in FIG. 8 outputs a signal to the fourth terminal 14 without outputting any signal to the third terminal 13, when a signal is flowing from the first terminal 11 to the second terminal 12.

The directional coupler 1 shown in FIG. 8 outputs a signal to the third terminal 13 without outputting any signal to the fourth terminal 14, when a signal is flowing from the second terminal 12 to the first terminal 11.

The fourth terminal 14 is an output terminal for signals.

The multiplier and adder/subtractor circuit 23 includes a first input terminal 81, a second input terminal 82, and an output terminal 83.

The multiplier and adder/subtractor circuit 23 also includes a third amplifier circuit 91, a fourth amplifier circuit 92, and a second adder circuit 93.

The first input terminal 81 is a terminal via which a first voltage $V_1$ applied to one end of the resistive element 21 is inputted in the multiplier and adder/subtractor circuit 23.

The second input terminal 82 is a terminal via which a second voltage $V_2$ applied to the other end of the resistive element 21 is inputted in the multiplier and adder/subtractor circuit 23.

The output terminal 83 is a terminal via which the multiplier and adder/subtractor circuit 23 outputs a signal.

In the directional coupler 1 shown in FIG. 8, the first input terminal 81 is connected to the one end of the resistive element 21. However, this is only an example, and the first input terminal 81 may be connected to the other end of the resistive element 21.

A positive side input terminal of the third amplifier circuit 91 is connected to the one end of the resistive element 21 via the first input terminal 81, and a negative side input terminal of the third amplifier circuit 91 is connected to ground.

The third amplifier circuit 91 outputs a current $I_3$ directly proportional to the first voltage $V_1$ to the second adder circuit 93 by amplifying the first voltage $V_1$ at a third amplification factor $G_3$.

Strictly interpreting the above direct proportion, the current $I_3$ directly proportional to the first voltage $V_1$ is zero when the first voltage $V_1$ is zero. However, the above direct proportion is not limited to the strict direct proportion, and also includes a case in which the current $I_3$ is not zero even when the first voltage $V_1$ is zero.

In the directional coupler 1 shown in FIG. 8, it is assumed that the third amplification factor in the third amplifier circuit 91 is $G_3$. However, this is only an example, and the third amplification factor in the third amplifier circuit 91 may be the same as a first amplification factor $G_1$ in a first amplifier circuit 34.

In case that the positive side input terminal of the third amplifier circuit 91 is connected to the other end of the resistive element 21 via the first input terminal 81, the third amplifier circuit 91 outputs a current $I_3'$ directly proportional to the second voltage $V_2$ to the second adder circuit 93 by amplifying the second voltage $V_2$ at a third amplification factor $G_3'$.

Strictly interpreting the above direct proportion, the current $I_3'$ directly proportional to the second voltage $V_2$ is zero when the second voltage $V_2$ is zero. However, the above direct proportion is not limited to the strict direct proportion, and also includes a case in which the current $I_3'$ is not zero even when the second voltage $V_2$ is zero.

A positive side input terminal of the fourth amplifier circuit 92 is connected to the one end of the resistive element 21 via the first input terminal 81, and a negative side input terminal of the fourth amplifier circuit 92 is connected to the other end of the resistive element 21 via the second input terminal 82.

When a signal is flowing from the second terminal 12 to the first terminal 11, the fourth amplifier circuit 92 outputs a third current $-I_4$ directly proportional to the voltage difference $V_2-V_1$ between the first voltage $V_1$ and the second voltage $V_2$ to the second adder circuit 93 by amplifying the voltage difference $V_2-V_1$ at a fourth amplification factor $G_4$. The polarity of the third current $-I_4$ is different from that of the current $I_3$ outputted from the third amplifier circuit 91.

When a signal is flowing from the first terminal 11 to the second terminal 12, the fourth amplifier circuit 92 outputs a fourth current $+I_4$ directly proportional to the voltage difference $V_2-V_1$ between the first voltage $V_1$ and the second voltage $V_2$ to the second adder circuit 93 by amplifying the voltage difference $V_2-V_1$ at the fourth amplification factor $G_4$. The polarity of the fourth current $+I_4$ is identical to that of the current $I_3$ outputted from the third amplifier circuit 91.

Strictly interpreting the above direct proportion, each of the third current $-I_4$ directly proportional to the voltage difference $V_2-V_1$ and the fourth current $+I_4$ directly proportional to the voltage difference $V_2-V_1$ is zero when the voltage difference $V_2-V_1$ is zero. However, the above direct proportion is not limited to the strict direct proportion, and also includes a case in which each of the third and fourth currents $-I_4$ and $+I_4$ is not zero even when the voltage difference $V_2-V_1$ is zero.

In the directional coupler 1 shown in FIG. 8, it is assumed that the fourth amplification factor in the fourth amplifier circuit 92 is $G_4$. However, this is only an example, and the fourth amplification factor in the fourth amplifier circuit 92 may be the same as a second amplification factor $G_2$ in a second amplifier circuit 35.

When a signal is flowing from the first terminal 11 to the second terminal 12, the second adder circuit 93 outputs a signal having a voltage value directly proportional to a current $I_3+I_4$ which is the sum total of the current $I_3$ outputted from the third amplifier circuit 91 and the fourth current $+I_4$ outputted from the fourth amplifier circuit 92 to the fourth terminal 14 via the output terminal 83.

Strictly interpreting the above direct proportion, the voltage value directly proportional to the current $I_3+I_4$ is zero when the current $I_3+I_4$ is zero. However, the above direct proportion is not limited to the strict direct proportion, and also includes a case in which the voltage value is not zero even when the current $I_3+I_4$ is zero.

When a signal is flowing from the second terminal 12 to the first terminal 11, the second adder circuit 93 outputs a signal having a voltage value directly proportional to a current $I_3-I_4$ which is the sum total of the current $I_3$ outputted from the third amplifier circuit 91 and the third current $-I_4$ outputted from the fourth amplifier circuit 92 to the fourth terminal 14 via the output terminal 83.

Strictly interpreting the above direct proportion, the voltage value directly proportional to the current $I_3-I_4$ is zero when the current $I_3-I_4$ is zero. However, the above direct proportion is not limited to the strict direct proportion, and also includes a case in which the voltage value is not zero even when the current $I_3-I_4$ is zero.

Next, the operation of the directional coupler 1 shown in FIG. 8 will be explained.

The operation of the multiplier and adder/subtractor circuit 22 is the same as that of Embodiment 1, and the multiplier and adder/subtractor circuit 22 does not output any signal to the third terminal 13 when a signal is flowing from the first terminal 11 to the second terminal 12. The multiplier and adder/subtractor circuit 22 outputs a signal to the third terminal 13 when a signal is flowing from the second terminal 12 to the first terminal 11.

When a signal is inputted from the first terminal 11, the signal inputted from the first terminal 11 flows toward the second terminal 12.

At this time, the first voltage $V_1$ is applied to the one end of the resistive element 21, and the second voltage $V_2$ is applied to the other end of the resistive element 21.

The voltage value of the second voltage $V_2$ is lower than that of the first voltage $V_1$ by the amount of voltage drop in the resistive element 21. Therefore, $V_1 > V_2$.

The first voltage $V_1$ is applied to the one end of the resistive element 21, and, as a result, the first voltage $V_1$ is applied to the positive side input terminal of the third amplifier circuit 91.

Because ground is connected to the negative side input terminal of the third amplifier circuit 91, the voltage applied to the negative side input terminal of the third amplifier circuit 91 is a ground potential $V_{GND}$ and is approximately 0 volts.

The third amplifier circuit 91 amplifies the first voltage $V_1$ which is the voltage difference between the first voltage $V_1$ applied to the positive side input terminal and the ground potential $V_{GND} \approx 0$ applied to the negative side input terminal at the third amplification factor $G_3$.

The third amplifier circuit 91 outputs the current $I_3$ directly proportional to the first voltage $V_1$ to the second adder circuit 93 by amplifying the first voltage $V_1$ at the third amplification factor $G_3$.

The first voltage $V_1$ is applied to the one end of the resistive element 21, and, as a result, the first voltage $V_1$ is applied to the positive side input terminal of the fourth amplifier circuit 92.

The second voltage $V_2$ is applied to the other end of the resistive element 21, and, as a result, the second voltage $V_2$ is applied to the negative side input terminal of the fourth amplifier circuit 92.

The fourth amplifier circuit 92 amplifies the voltage difference $V_2 - V_1$ between the first voltage $V_1$ applied to the positive side input terminal and the second voltage $V_2$ applied to the negative side input terminal at the fourth amplification factor $G_4$. Because $V_1 > V_2$ when a signal is flowing from the first terminal 11 to the second terminal 12, the voltage difference $V_2 - V_1$ has a positive voltage value.

Therefore, the fourth amplifier circuit 92 outputs the fourth current $+I_4$ directly proportional to the voltage difference $V_2 - V_1$ to the second adder circuit 93 by amplifying the voltage difference $V_2 - V_1$ at the fourth amplification factor $G_4$.

The second adder circuit 93 outputs a signal having a voltage value directly proportional to the current $I_3 + I_4$ which is the sum total of the current $I_3$ outputted from the third amplifier circuit 91 and the fourth current $+I_4$ outputted from the fourth amplifier circuit 92 to the fourth terminal 14 via the output terminal 83.

Therefore, when a signal is flowing from the first terminal 11 to the second terminal 12, a signal having the voltage value directly proportional to the total current $I_3 + I_4$ is outputted from the fourth terminal 14.

When a signal is inputted from the second terminal 12, the signal inputted from the second terminal 12 flows toward the first terminal 11.

At this time, the second voltage $V_2$ is applied to the other end of the resistive element 21, and the first voltage $V_1$ is applied to the one end of the resistive element 21.

The voltage value of the first voltage $V_1$ is lower than that of the second voltage $V_2$ by the amount of voltage drop in the resistive element 21. Therefore, $V_2 > V_1$.

The first voltage $V_1$ is applied to the one end of the resistive element 21, and, as a result, the first voltage $V_1$ is applied to the positive side input terminal of the third amplifier circuit 91.

Because ground is connected to the negative side input terminal of the third amplifier circuit 91, the voltage applied to the negative side input terminal of the third amplifier circuit 91 is the ground potential $V_{GND}$ and is approximately 0 volts.

The third amplifier circuit 91 amplifies the first voltage $V_1$ which is the voltage difference between the first voltage $V_1$ applied to the positive side input terminal and the ground potential $V_{GND} \approx 0$ applied to the negative side input terminal at the third amplification factor $G_3$.

The third amplifier circuit 91 outputs the current $I_3$ directly proportional to the first voltage $V_1$ to the second adder circuit 93 by amplifying the first voltage $V_1$ at the third amplification factor $G_3$.

The first voltage $V_1$ is applied to the one end of the resistive element 21, and, as a result, the first voltage $V_1$ is applied to the positive side input terminal of the fourth amplifier circuit 92.

The second voltage $V_2$ is applied to the other end of the resistive element 21, and, as a result, the second voltage $V_2$ is applied to the negative side input terminal of the fourth amplifier circuit 92.

The fourth amplifier circuit 92 amplifies the voltage difference $V_2 - V_1$ between the first voltage $V_1$ applied to the positive side input terminal and the second voltage $V_2$ applied to the negative side input terminal at the fourth amplification factor $G_4$. Because $V_2 > V_1$ when a signal is flowing from the second terminal 12 to the first terminal 11, the voltage difference $V_2 - V_1$ has a negative voltage value.

Therefore, the fourth amplifier circuit 92 outputs the third current $-I_4$ directly proportional to the voltage difference $V_2 - V_1$ to the second adder circuit 93 by amplifying the voltage difference $V_2 - V_1$ at the fourth amplification factor $G_4$.

The second adder circuit 93 outputs a signal having a voltage value directly proportional to the current $I_3 - I_4$ which is the sum total of the current $I_3$ outputted from the third amplifier circuit 91 and the third current $-I_4$ outputted from the fourth amplifier circuit 92 to the fourth terminal 14 via the output terminal 83.

Therefore, when a signal is flowing from the second terminal 12 to the first terminal 11, a signal having the voltage value directly proportional to the total current $I_3 - I_4$ is outputted from the fourth terminal 14.

However, in the directional coupler 1 shown in FIG. 8, the third amplifier circuit 91 amplifies the first voltage $V_1$ at the third amplification factor $G_3$ at which the total current $I_3 - I_4$ is zero. Here, the case in which the total current $I_3 - I_4$ is zero is not limited to the case in which the total current is strictly zero, and includes a case in which the total current has a current value which is negligible in practical applications of the directional coupler.

Further, the fourth amplifier circuit 92 amplifies the voltage difference $V_2 - V_1$ at the fourth amplification factor $G_4$ at which the total current $I_3 - I_4$ is zero.

The third amplification factor $G_3$ and the fourth amplification factor $G_4$ at which the total current $I_3 - I_4$ is zero have a relation shown by the following equation (3).

$$G_4 = G_3 \times \frac{R_0}{R} \tag{3}$$

Therefore, in the directional coupler 1 shown in FIG. 8, when a signal is flowing from the second terminal 12 to the first terminal 11, no signal is outputted from the fourth terminal 14 because the total current $I_3-I_4$ is zero.

In the directional coupler 1 shown in FIG. 8, the first input terminal 81 is connected to the one end of the resistive element 21. However, this is only an example, and the first input terminal 81 may be connected to the other end of the resistive element 21.

In the case where the first input terminal 81 is connected to the other end of the resistive element 21, the third amplification factor $G_3'$ and the fourth amplification factor $G_4$ at which the total current $I_3'I_4$ is zero have a relation shown by the following equation (4).

$$G_4 = G_3' \times \frac{R_0 + R}{R} \quad (4)$$

The directional coupler 1 of above-mentioned Embodiment 3 includes the third amplifier circuit 91 for outputting a current directly proportional to the first voltage applied to the one end of the resistive element 21, and the fourth amplifier circuit 92 for outputting a third current which is directly proportional to the voltage difference between the first voltage and the second voltage and whose polarity is different from that of the current outputted from the third amplifier circuit 91 when a signal is flowing from the second terminal 12 to the first terminal 11, and for outputting a fourth current which is directly proportional to the voltage difference between the first voltage and the second voltage and whose polarity is identical to that of the current outputted from the third amplifier circuit 91 when a signal is flowing from the first terminal 11 to the second terminal 12. The directional coupler 1 also includes the second adder circuit 93 for outputting either a signal having a voltage value directly proportional to a current which is the sum total of the current outputted from the third amplifier circuit 91 and the third current, or a signal having a voltage value directly proportional to a current which is the sum total of the current outputted from the third amplifier circuit 91 and the fourth current to the fourth terminal 14. Therefore, the directional coupler 1 to which each of the first terminal 11, the second terminal 12, the third terminal 13, and the fourth terminal 14 is connected can avoid upsizing of the physical size also in applications where a signal in a low frequency band is inputted.

It is to be understood that any combination of two or more of the above-mentioned embodiments can be made, various changes can be made in any component according to any one of the above-mentioned embodiments, or any component according to any one of the above-mentioned embodiments can be omitted within the scope of the present disclosure.

INDUSTRIAL APPLICABILITY

The present disclosure is suitable for directional couplers and semiconductor chips.

REFERENCE SIGNS LIST

1: directional coupler,
11: first terminal,
12: second terminal,
13: third terminal,
14: fourth terminal,
21: resistive element,
22: multiplier and adder/subtractor circuit,
23: multiplier and adder/subtractor circuit,
31: first input terminal,
32: second input terminal,
33: output terminal,
34: first amplifier circuit,
35: second amplifier circuit,
36: first adder circuit,
37: first amplifier circuit,
40: power supply voltage line,
41: input terminal,
42: input terminal,
43: output terminal,
44: first pull-up resistor,
45: first N-type transistor,
46: second N-type transistor,
47: first current source,
48: ground,
50: power supply voltage line,
51: input terminal,
52: input terminal,
53: output terminal,
54: second pull-up resistor,
55: third N-type transistor,
56: fourth N-type transistor,
57: second current source,
58: ground,
60: power supply voltage line,
61: input terminal,
62: input terminal,
63: output terminal,
64: load resistor,
71: level shifter,
71a: power supply voltage line,
71b: current source,
71c: PMOS transistor,
71d: ground,
72: level shifter,
72a: power supply voltage line,
72b: current source,
72c: PMOS transistor,
72d: ground,
73: level shifter,
73a: power supply voltage line,
73b: current source,
73c: PMOS transistor,
73d: ground,
74: level shifter,
74a: power supply voltage line,
74b: current source,
74c: PMOS transistor,
74d: ground,
81: first input terminal,
82: second input terminal,
83: output terminal,
91: third amplifier circuit,
92: fourth amplifier circuit, and
93: second adder circuit.

The invention claimed is:

1. A directional coupler comprising:
a resistive element in which one end thereof is connected to a first terminal and the other end thereof is connected to a second terminal;
a first amplifier circuit to output either a current directly proportional to a first voltage applied to the one end of the resistive element or a current directly proportional to a second voltage applied to the other end of the resistive element;

a second amplifier circuit to output a first current which is directly proportional to a voltage difference between the first voltage applied to the one end of the resistive element and the second voltage applied to the other end of the resistive element and whose polarity is different from that of the current outputted from the first amplifier circuit when a signal is flowing from the first terminal to the second terminal, and to output a second current which is directly proportional to the voltage difference and whose polarity is identical to that of the current outputted from the first amplifier circuit when a signal is flowing from the second terminal to the first terminal; and a first adder circuit to output either a signal having a voltage value directly proportional to a current which is a sum total of the current outputted from the first amplifier circuit and the first current or a signal having a voltage value directly proportional to a current which is a sum total of the current outputted from the first amplifier circuit and the second current to a third terminal.

2. The directional coupler according to claim 1, wherein the first amplifier circuit either outputs a current directly proportional to the first voltage by amplifying the first voltage at a first amplification factor, or outputs a current directly proportional to the second voltage by amplifying the second voltage at the first amplification factor, and the second amplifier circuit outputs the first current directly proportional to the voltage difference between the first voltage and the second voltage by amplifying the voltage difference at a second amplification factor when a signal is flowing from the first terminal to the second terminal, whereas the second amplifier circuit outputs the second current directly proportional to the voltage difference by amplifying the voltage difference at the second amplification factor when a signal is flowing from the second terminal to the first terminal.

3. The directional coupler according to claim 2, wherein when a signal is flowing from the first terminal to the second terminal, the first amplifier circuit amplifies either the first voltage or the second voltage at the first amplification factor at which the total current is zero, and the second amplifier circuit amplifies the voltage difference at the second amplification factor at which the total current is zero.

4. The directional coupler according to claim 3, wherein the first amplifier circuit has a positive side input terminal connected to the one end of the resistive element and a negative side input terminal connected to ground, and amplifies a voltage difference between the first voltage and a ground potential at the first amplification factor.

5. The directional coupler according to claim 4, wherein when the first amplification factor is $G_1$, the second amplification factor is $G_2$, impedance of the resistive element is R, and impedance when an outside is viewed from the first terminal and impedance when an outside is viewed from the second terminal are $R_0$, the first amplification factor and the second amplification factor have a relation expressed by a following relational expression.

$$G_2 = G_1 \times \frac{R_0}{R} \qquad \text{[Relational expression]}$$

6. The directional coupler according to claim 3, wherein the first amplifier circuit has a positive side input terminal connected to the other end of the resistive element and a negative side input terminal connected to ground, and amplifies a voltage difference between the second voltage and ground potential at the first amplification factor.

7. The directional coupler according to claim 6, wherein when the first amplification factor is $G_1'$, the second amplification factor is $G_2$, impedance of the resistive element is R, and impedance when an outside is viewed from the first terminal and impedance when an outside is viewed from the second terminal are $R_0$, the first amplification factor and the second amplification factor have a relation expressed by a following relational expression.

$$G_2 = G_1' \times \frac{R_0 + R}{R} \qquad \text{[Relational expression]}$$

8. The directional coupler according to claim 1, wherein the first amplifier circuit includes:
a first pull-up resistor in which a power supply voltage is applied to one end thereof;
a first N-type transistor in which a gate terminal is connected to ground and a drain terminal is connected to the other end of the first pull-up resistor;
a second N-type transistor in which a gate terminal is connected to either the one end or the other end of the resistive element, and a source terminal is connected to a source terminal of the first N-type transistor; and
a first current source in which a positive side terminal is connected to each of the source terminals of the first and second N-type transistors, and a negative side terminal is connected to ground, thereby outputting a current from a drain terminal of the second N-type transistor to the first adder circuit, and wherein
the second amplifier circuit includes:
a second pull-up resistor in which a power supply voltage is applied to one end thereof;
a third N-type transistor in which a gate terminal is connected to the one end of the resistive element and a drain terminal is connected to the other end of the second pull-up resistor;
a fourth N-type transistor in which a gate terminal is connected to the other end of the resistive element, and a source terminal is connected to a source terminal of the third N-type transistor; and
a second current source in which a positive side terminal is connected to each of the source terminals of the third and fourth N-type transistors, and a negative side terminal is connected to ground, thereby outputting either the first current or the second current from a drain terminal of the fourth N-type transistor to the first adder circuit.

9. The directional coupler according to claim 8, wherein the first adder circuit includes a load resistor in which a power supply voltage is applied to one end thereof, and the other end thereof is connected to each of the drain terminal of the second N-type transistor, the drain terminal of the fourth N-type transistor, and the third terminal.

10. The directional coupler according to claim 1, wherein the directional coupler comprises:
a third amplifier circuit to output either a current directly proportional to the first voltage applied to the one end of the resistive element or a current directly proportional to the second voltage applied to the other end of the resistive element;
a fourth amplifier circuit to output a third current which is directly proportional to the voltage difference between the first voltage and the second voltage and whose polarity is different from that of the current outputted from the third amplifier circuit when a signal is flowing from the second terminal to the first terminal, and to output a fourth current which is directly proportional to the voltage difference and whose polarity is identical to that of the current outputted from the third amplifier circuit when a signal is flowing from the first terminal to the second terminal; and a second adder circuit to output either a signal having a voltage value directly proportional to a current which is a sum total of the current outputted from the third amplifier circuit and the third current or a signal having a voltage value directly proportional to a current which is a sum total of the current outputted from the third amplifier circuit and the fourth current to a fourth terminal.

11. A semiconductor chip comprising the directional coupler according to claim 1.

12. A semiconductor chip comprising the directional coupler according to claim 2.

13. A semiconductor chip comprising the directional coupler according to claim 3.

14. A semiconductor chip comprising the directional coupler according to claim 4.

15. A semiconductor chip comprising the directional coupler according to claim 5.

16. A semiconductor chip comprising the directional coupler according to claim 6.

17. A semiconductor chip comprising the directional coupler according to claim 7.

18. A semiconductor chip comprising the directional coupler according to claim 8.

19. A semiconductor chip comprising the directional coupler according to claim 9.

20. A semiconductor chip comprising the directional coupler according to claim 10.

* * * * *